United States Patent
Hung

(10) Patent No.: US 9,170,586 B2
(45) Date of Patent: Oct. 27, 2015

(54) COMPUTER DEVICE AND METHOD FOR DISSIPATING HEAT FROM A DISCRETE GRAPHICS PROCESSING UNIT IN THE SAME

(75) Inventor: Li-Te Hung, Taipei (TW)

(73) Assignee: QUANTA COMPUTER INC., Guishan Dist., Taoyuan (TW)

( * ) Notice: Subject to any disclaimer, the term of this patent is extended or adjusted under 35 U.S.C. 154(b) by 639 days.

(21) Appl. No.: 13/615,334

(22) Filed: Sep. 13, 2012

(65) Prior Publication Data

US 2013/0269922 A1 Oct. 17, 2013

(30) Foreign Application Priority Data

Apr. 13, 2012 (TW) ............................. 101113279 A

(51) Int. Cl.
  *G06F 1/20* (2006.01)
  *G05D 23/00* (2006.01)
  *F28D 15/00* (2006.01)
  *G05D 23/19* (2006.01)
  *H05K 1/02* (2006.01)

(52) U.S. Cl.
  CPC ............ *G05D 23/1917* (2013.01); *G06F 1/206* (2013.01); *H05K 1/0201* (2013.01); *H05K 2201/10151* (2013.01); *Y02B 60/1275* (2013.01)

(58) Field of Classification Search
  None
  See application file for complete search history.

(56) References Cited

U.S. PATENT DOCUMENTS

| | | | |
|---|---|---|---|
| 6,702,665 B1 * | 3/2004 | Tai | 454/256 |
| 2010/0117579 A1 * | 5/2010 | Culbert et al. | 318/471 |
| 2010/0315223 A1 * | 12/2010 | Gross et al. | 340/500 |
| 2011/0002098 A1 | 1/2011 | Xu | |
| 2012/0081056 A1 * | 4/2012 | Tian et al. | 318/472 |

FOREIGN PATENT DOCUMENTS

TW 2011-11995 A1 4/2011

* cited by examiner

*Primary Examiner* — Sean Shechtman
(74) *Attorney, Agent, or Firm* — Rabin & Berdo, P.C.

(57) ABSTRACT

A computer device and a method for dissipating heat from a discrete graphics processing unit therein are provided. The method thereof includes determining whether the discrete graphics processing is in an operating state. If the discrete graphics processing unit is in an operating state, a determination is made as to whether a current temperature of the discrete graphics processing unit can be obtained. If the current temperature of the discrete graphics processing unit cannot be obtained, the discrete graphics processing unit is cooled so as to lower the current temperature thereof.

9 Claims, 4 Drawing Sheets

COMPUTER DEVICE AND METHOD FOR DISSIPATING HEAT FROM A DISCRETE GRAPHICS PROCESSING UNIT IN THE SAME

RELATED APPLICATIONS

This application claims priority to Taiwan Application Serial Number 101113279, filed Apr. 13, 2012, which is herein incorporated by reference.

BACKGROUND

1. Technical Field

The present invention relates to a method for dissipating heat from a computer device, and more particularly to a method for dissipating heat from a graphics processing unit of the computer device.

2. Description of Related Art

Since an ever-increasing amount of heat is generated from each of the electronic components of a computer device (e.g., a discrete graphics processing unit, central process unit, etc. thereof), if the heat cannot be removed in a timely manner, the inside temperature of the computer device might increase rapidly so that the electronic component operates abnormally or stops operating altogether. In some instances, the electronic component might be damaged permanently.

Consequently, the electronic component is normally installed with a heat-dissipating fan to dissipate the heat therefrom. Thus, by airflows created by operation of the heat-dissipating fan, the heat from the electronic component can be removed quickly so as to decrease the inside temperature of the electronic component.

Commercially available computers include those that individually use a graphical module that provides a low graphical performance effect, that is, an integrated graphics processor (IGP) which is integrated into a chipset of a computer device; individually use a graphical module that provides a high graphical performance effect, that is, a discrete graphics processing unit (DGPU); or use both the foregoing graphical modules (i.e., an IGP and a DGPU) in combination. When a user of a computer installed with both an IGP and a DGPU is executing a software program requiring a high graphical performance effect, such as graphics software, image processing software, 3D game software, etc., the computer switches to operate the DGPU as the active graphical module. On the other hand, when the user is executing another software program requiring a low graphical performance effect, such as a word processing software program or an Internet browser, the computer switches to operate the IGP for the active graphical module. Hence, the sources of the computer are used in an advantageous manner.

The current operating temperature of a DGPU of a computer installed with both an IGP and a DGPU can be obtained using a temperature detection circuit which is independently installed in the computer, so that a heat-dissipating fan can be controlled to provide a certain volume of cool air depending on the operating temperature of the DGPU to thereby cool the DGPU.

Some manufacturers in the computer industry consider omitting the temperature detection circuit which is independently installed in the computer and associated with the DGPU, so as to reduce manufacturing costs, reduce power consumption, and minimize the amount of internal space utilized by circuitry in the computer. However, as a result, the computer cannot be instantly aware of the temperature changes of the DGPU, and thus, it is not possible to determine whether the DGPU has stopped operating due to overheating or due to the fact that switching has been performed to operate the IGP instead. Moreover, appropriate cooling of the DGPU cannot be immediately performed, so as to possibly result in damage to the DGPU.

Therefore, there is a need in the art to provide a method for dissipating heat from a graphics processing unit of a computer device in order to effectively solve the aforementioned problems.

SUMMARY

One aspect of the present invention provides a method for dissipating heat from a discrete graphics processing unit in a computer device.

A determination is made as to whether the discrete graphics processing unit is in an operating state. When the discrete graphics processing unit is in an operating state, another determination is made as to whether a current temperature of the discrete graphics processing unit can be obtained from inside the discrete graphics processing unit. When the current temperature of the discrete graphics processing unit cannot be obtained, the discrete graphics processing unit is cooled so as to lower the current temperature of the discrete graphics processing unit.

Another aspect of the present invention provides a computer device. The computer device comprises a discrete graphics processing unit, a fan module, and an embedded controller electrically connected the discrete graphics processing unit and the fan module. When the embedded controller determines that the discrete graphics processing unit is in an operating state, the embedded controller determines whether a current temperature of the discrete graphics processing unit can be obtained from inside the discrete graphics processing unit. When the current temperature of the discrete graphics processing unit is obtained by the embedded controller, the embedded controller controls the fan module to provide a certain volume of air corresponding to the current temperature to dissipate heat from the discrete graphics processing unit. When the current temperature of the discrete graphics processing unit is cannot be obtained by the embedded controller, the embedded controller lowers the current temperature of the discrete graphics processing unit.

The independently installed temperature detection circuit associated with the DGPU can be omitted from the configuration of the computer device of the invention so as to reduce manufacturing costs, reduce power consumption, and minimize the amount of internal space utilized by circuitry in the computer device. Furthermore, even though the aforementioned temperature detection circuit is no longer installed in the computer device, through the aforementioned method for dissipating heat from the discrete graphics processing unit in the computer device, the computer device of the invention still can be instantly aware of temperature changes of the DGPU and thereby achieve heat dissipation of the DGPU so as to avoid damage to the DGPU.

BRIEF DESCRIPTION OF THE DRAWINGS

The present invention will be apparent to those skilled in the art by reading the following detailed description of a preferred embodiment thereof, with reference to the attached drawings, in which.

DESCRIPTION OF THE EMBODIMENTS

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
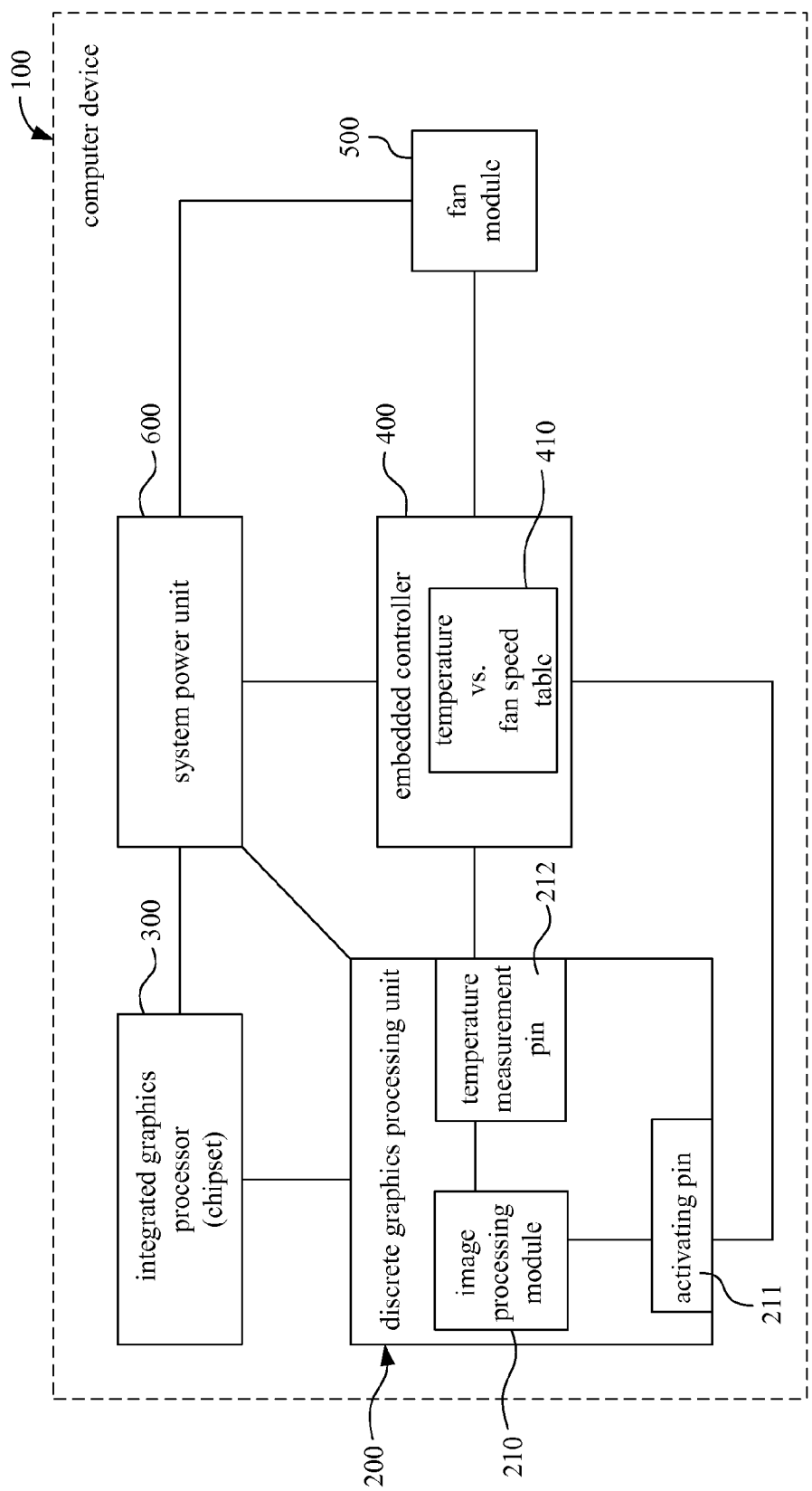
FIG. 1 is a block diagram illustrating a computer device according to one embodiment of the present invention.

Reference is first made to FIG. 1. FIG. 1 is a block diagram illustrating a computer device 100 according to one embodiment of the present invention.

The computer device 100 comprises a discrete graphics processing unit (DGPU, or discrete graphics processor) 200, an integrated graphics processor (IGP) 300, an embedded controller (EC) 400, a fan module 500 and a system power unit 600. The system power unit 600 is electrically connected the discrete graphics processing unit 200, the integrated graphics processor 300, the embedded controller 400, and the fan module 500, and provides these elements 200, 300, 400, 500 with required electric power. The integrated graphics processor 300 can be integrated into a central process unit (CPU) or a chipset (e.g., Southbridge chipset or Northbridge Chipset), and is electrically connected the discrete graphics processing unit 200. In one specific embodiment, the system power unit 600 is directly electrically connected to the discrete graphics processing unit 200.

It is noted that the discrete graphics processing unit 200, the integrated graphics processor 300, the embedded controller 400 and the fan module 500 are electrically connected the system power unit 600 for receiving electric power, and since the embedded controller 400 is electrically connected the system power unit 600, the embedded controller 400 can send control signals to the system power unit 600 for turning on or off the electric power of the discrete graphics processing unit 200 and the integrated graphics processor 300.

The discrete graphics processing unit 200, for example, can be an independent graphics card, and includes an image processing module 210. The image processing module 210, for example, can be a chip. In the embodiment, in order to determine whether the discrete graphics processing unit 200 is in an operating state, one of pins of the discrete graphics processing unit 200, e.g., a power supply pin, an enable/disable pin or a backlight communication pin, can be read for determining. For convenience, the aforementioned pin for determining whether the discrete graphics processing unit 200 is in an operating state is referred to as an activating pin 211. Furthermore, the discrete graphics processing unit 200 further includes a temperature measurement pin 212 for providing a current operating temperature (i.e., temperature value) of the discrete graphics processing unit 200.

The fan module 500 blows air towards the image processing module 210 of the discrete graphics processing unit 200 for dissipating heat from the image processing module 210.

The embedded controller 400 is electrically connected with the discrete graphics processing unit 200 and the fan module 500. The embedded controller 400 includes a "temperature vs. fan speed" table 410 stored therein.

The "temperature vs. fan speed" table 410 is provided with a "temperature range" field and a "fan speed" field. There are a number of different temperature ranges in the "temperature range" field, and a number of fan speed settings in the "fan speed" field. The fan speed settings respectively correspond to the temperature ranges, so that the fan module 500 can output a certain volume of air for one of the fan speed settings corresponding to one of the temperature ranges. For instance, the temperature range from 60 degrees Celsius to 70 degrees Celsius may corresponds to a fan speed setting of 3200 RPM, and the temperature range from 50 degrees Celsius to 60 degrees Celsius may correspond to a fan speed setting of 2400 RPM.

Figure 2:
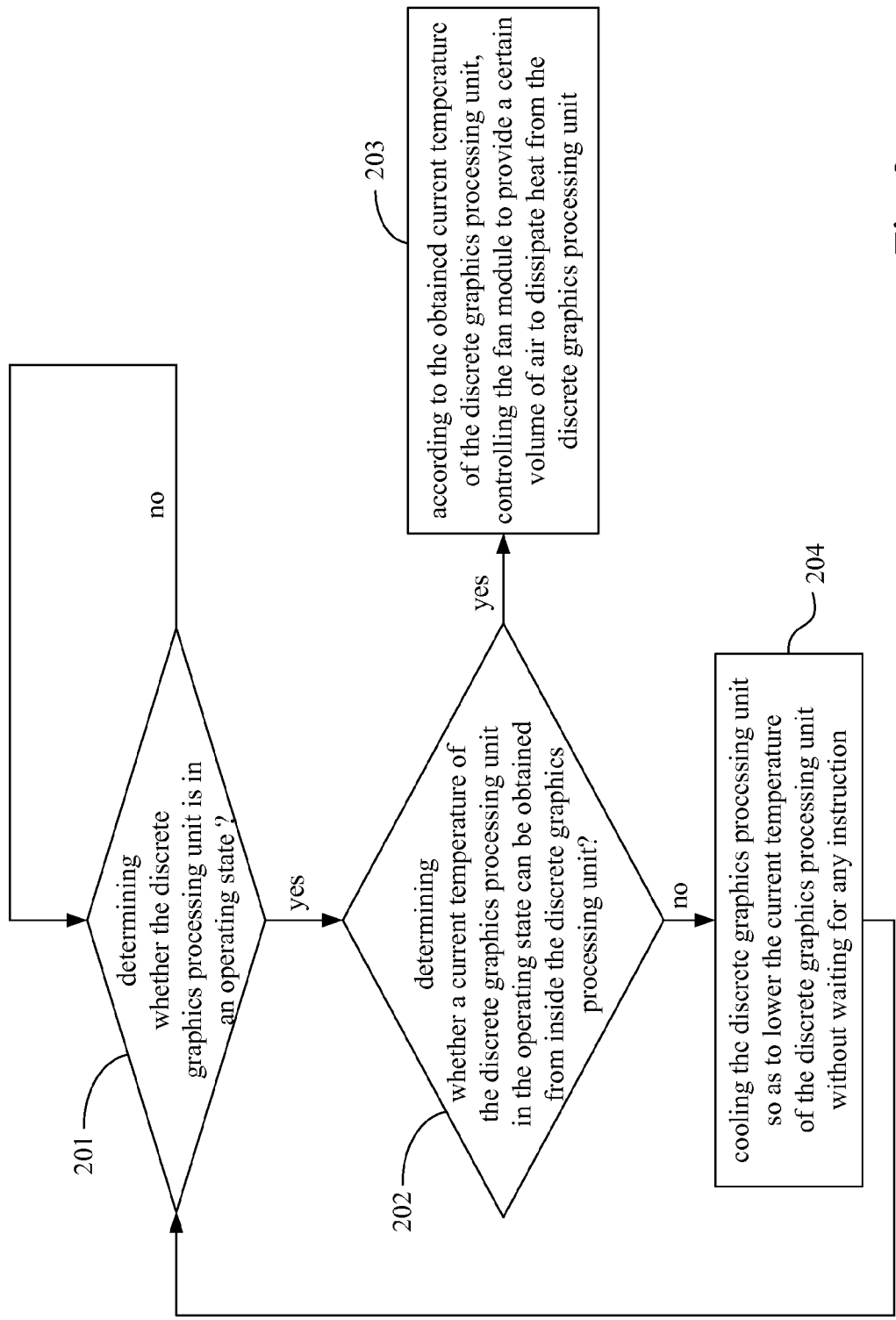
FIG. 2 is a flowchart illustrating a method for dissipating heat from a discrete graphics processing unit in the computer device of FIG. 1 according to one embodiment of the present invention.

Reference is now made to FIG. 2. FIG. 2 is a flowchart illustrating a method for dissipating heat from the discrete graphics processing unit 200 in the computer device 100 of FIG. 1 according to one embodiment of the present invention.

In the embodiment, after the computer device 100 is booted, the embedded controller 400 of the computer device 100 processes the method of the invention for dissipating heat from the discrete graphics processing unit 200 in the computer device 100. The method comprises the steps as outlined below.

In Step (201), the embedded controller 400 of the computer device 100 determines whether the discrete graphics processing unit 200 is in an operating state. If the discrete processing unit 200 is in an operating state, the routine goes to Step (202), otherwise, the routine returns back to Step (201) for another determination.

In Step (202), the embedded controller 400 of the computer device 100 then determines whether a current temperature (i.e., temperature value) of the discrete graphics processing unit 200 can be obtained from inside the discrete graphics processing unit 200. If the current temperature of the discrete graphics processing unit 200 can be obtained from inside the discrete the graphics processing unit 200, the routine goes to Step (203), otherwise, the routine goes to Step (204).

In Step (203), the embedded controller 400 of the computer device 100 then controls the fan module 500 to provide a certain volume of air to the discrete graphics processing unit 200 for dissipating heat from the discrete graphics processing unit 200 according to the obtained current temperature of the discrete graphics processing unit 200.

In Step (204), when the current temperature of the discrete graphics processing unit 200 cannot be obtained, the embedded controller 400 of the computer device 100 directly cools the discrete graphics processing unit 200 (to be described in greater detail below) so as to lower the temperature of the discrete graphics processing unit 200 without waiting for any instruction.

In greater detail, in Step (201), since the embedded controller 400 is electrically connected to the discrete graphics processing unit 200, by detecting the aforementioned activating pin 211 of the discrete graphics processing unit 200, the embedded controller 400 can determine whether the discrete graphics processing unit 200 is in an operating state. For example, assuming that the activating pin 211 is a power supply pin, when the embedded controller 400 has determined that the power supply pin of the discrete graphics processing unit 200 is at a high electrical potential, this indicates that the discrete graphics processing unit 200 is supplied with electric power, and thus, the discrete graphics processing unit 200 is in an operating state.

It is noted that the embedded controller 400 repeatedly detects the aforementioned activating pin 211 of the discrete graphics processing unit 200 at, for example, a frequency of 1 time per second.

When the embedded controller 400 determines that the discrete graphics processing unit 200 is not in an operating state, i.e. not supplied with electric power, this means that the discrete graphics processing unit 200 has stopped operating, and one reason may be that the integrated graphics processor 300 has been switched to be activated (i.e., has been placed in an operating state) for use as a main display process mode of the computer device 100.

Thus, the embedded controller 400 performs no control, and the routine returns to Step (201) so that the embedded controller 400 continually and repeatedly detects whether the activating pin 211 of the discrete graphics processing unit 200 indicates that the discrete graphics processing unit 200 is in an operating state.

After the embedded controller 400 has determined that the discrete graphics processing unit 200 is in an operating state, in Step (202), the embedded controller 400 attempts to obtain (e.g., read or request) a current temperature (i.e., temperature value) of the discrete graphics processing unit 200 via the temperature measurement pin 212 of the discrete graphics processing unit 200. For example, the embedded controller 400 continually sends a request to the discrete graphics processing unit 200 for the current temperature thereof during a specific time period. This specific time period is referred to as a first time period, and may be, for example, 25 seconds or a specific number of times (e.g., 25 times).

If the embedded controller 400 successfully obtains (e.g., reads or requests) the current temperature (i.e., temperature value) of the discrete graphics processing unit 200 via the temperature measurement pin 212 thereof, that is, the embedded controller 400 of the computer device 100 determines that the current temperature (i.e., temperature value) of the discrete graphics processing unit 200 can be obtained from inside the discrete graphics processing unit 200, the embedded controller 400 performs control as described in Step (203).

In Step (203), the corresponding fan speed setting in connection to the obtained current temperature is determined from the "temperature vs. fan speed" table 410, then the embedded controller 400 controls the fan module 500 to provide a certain volume of air to the discrete graphics processing unit 200 according to the obtained current temperature of the discrete graphics processing unit 200, so as to dissipate heat from the image processing module 210 of the discrete graphics processing unit 200. Hence, the temperature of the image processing module 210 is lowered according to the corresponding fan speed setting in the "temperature vs. fan speed" table 410.

On the other hand, if the embedded controller 400 is unable to obtain (e.g., read or request) the current temperature (i.e., temperature value) of the discrete graphics processing unit 200 during the first time period (e.g., 25 seconds) or after a specific number of times (e.g., 25 times), since the embedded controller 400 has determined that the discrete graphics processing unit 200 is in an operating state in Step (201), but the discrete graphic process unit 200 fails to provide its current temperature, this indicates that the discrete graphics processing unit 200 might be overheated and therefore is operating abnormally. In this case, without waiting for other instructions or making other determinations, the embedded controller 400 needs to immediately cool the discrete graphics processing unit 200, as described in Step (204).

Figure 3:
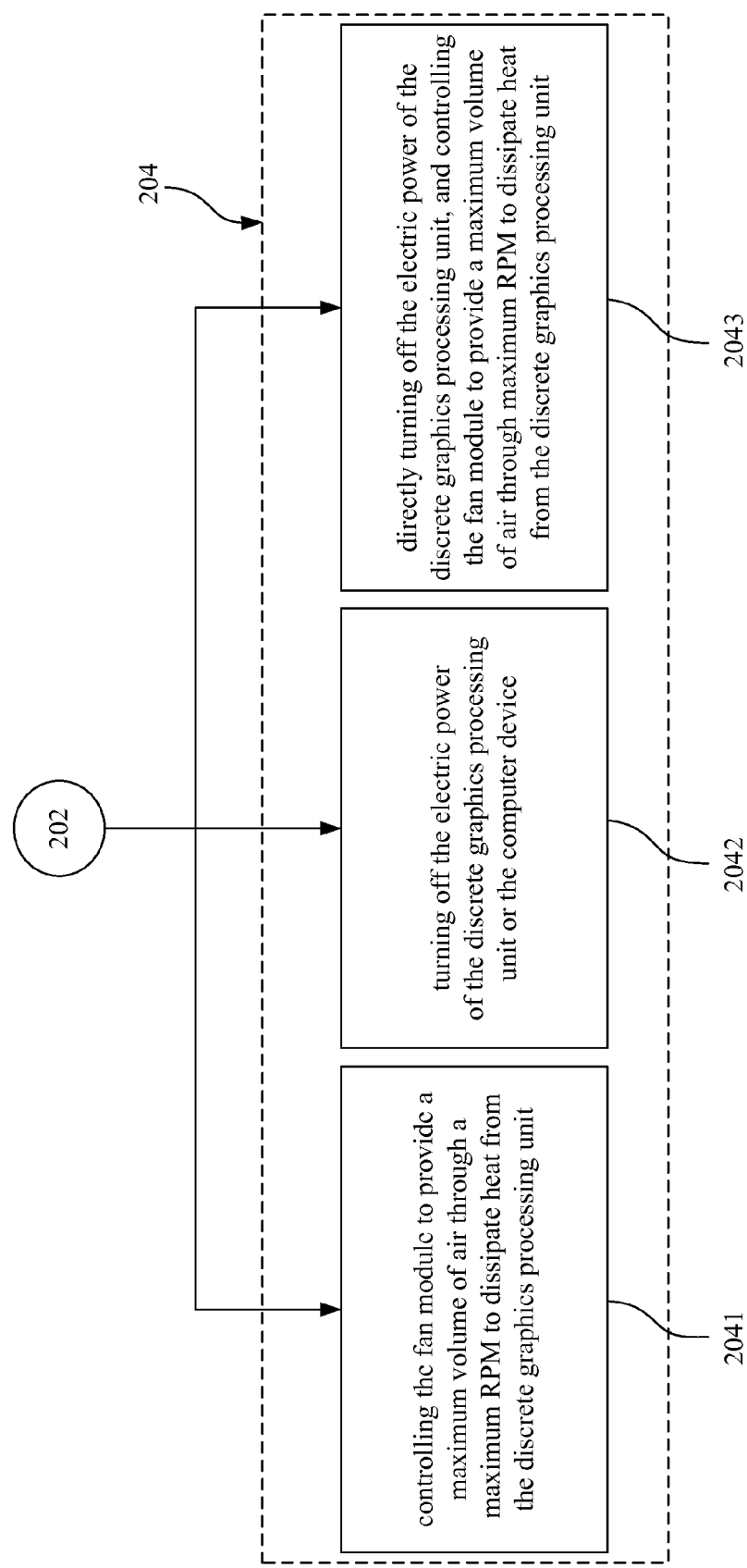
FIG. 3 is a detailed flowchart with multiple options with respect to Step 204 of the method in FIG. 2.

FIG. 3 is a detailed flowchart with multiple options with respect to Step 204 of the method in FIG. 2.

One option in Step (204) is detailed as Step (2041). In Step (2041), the embedded controller 400 controls the fan module 500 to provide a maximum volume of air through a maximum RPM to dissipate heat from the discrete graphics processing unit 200.

In some embodiments, the embedded controller 400 obtains a maximum fan speed setting from the "temperature vs. fan speed" table 410, and controls the fan module 500 to provide the maximum volume of air through a maximum RPM to dissipate heat from the discrete graphics processing unit 200 according to the maximum fan speed setting. Consequently, the current temperature of the discrete graphics processing unit 200 is lowered, so that damage to the discrete graphics processing unit 200 as a result of being overheated is prevented.

Different fan modules have different maximum RPM capabilities. Thus, in some embodiments, using a product specification of the fan module 500, which is stored as digital data in the embedded controller 400, the embedded controller 400 can get the maximum fan speed setting of the fan module 500 without using the "temperature vs. fan speed" table 410.

Another option in Step (204) is detailed as Step (2042). In Step (2042), the embedded controller 400 turns off the electric power of the discrete graphics processing unit 200.

In greater detail, the embedded controller 400 controls the system power unit 600 to turn off the electric power of the discrete graphics processing unit 200, or turn off the electric power of the computer device 100 to thereby shut down the computer device 100 without performing any cooling operation.

Still another option in Step (204) is detailed as Step (2043). In Step (2043), the embedded controller 400 directly turns off the electric power of the discrete graphics processing unit 200, and then controls the fan module 500 to provide a maximum volume of air through a maximum RPM to dissipate heat from the discrete graphics processing unit 200.

Figure 4:
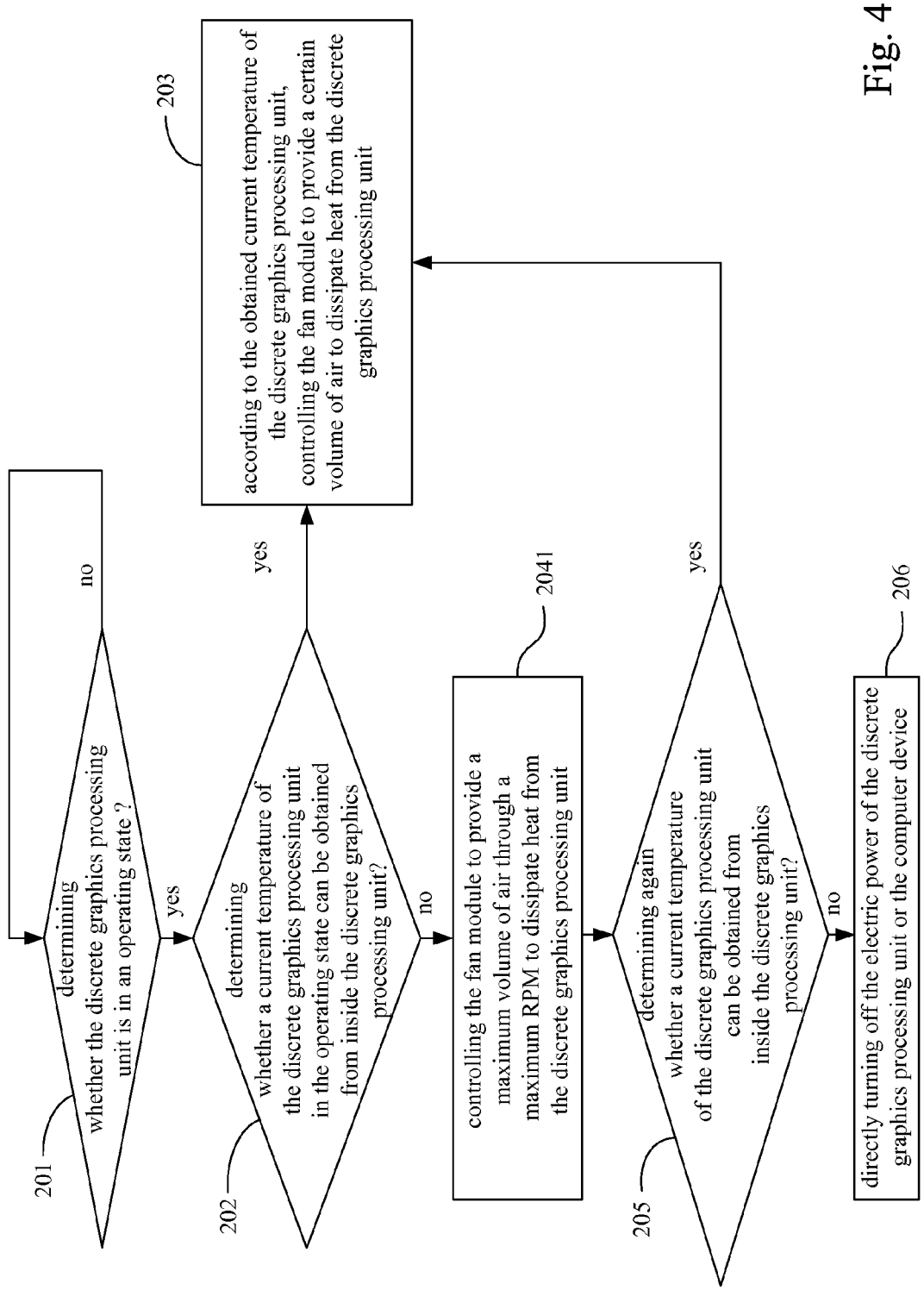
FIG. 4 is a flowchart illustrating a method for dissipating heat from the discrete graphics processing unit in the computer device of FIG. 1 according to another embodiment of the present invention.

FIG. 4 is a flowchart illustrating a method for dissipating heat from the discrete graphics processing unit 200 in the computer device 100 according to another embodiment of the present invention.

In this embodiment, after Step (2041) described with reference to FIG. 3 above, the method for dissipating heat from the discrete graphics processing unit 200 in the computer device 100 further comprises steps as outlined below.

In Step (205), the embedded controller 400 determines again whether a current temperature of the discrete graphics processing unit 200 can be obtained from inside the discrete graphics processing unit 200. If the current temperature of the discrete graphics processing unit 200 can be obtained form inside the discrete graphics processing unit 200, the routine returns to Step (203), otherwise, the routine continues to Step (206). For example, the embedded controller 400 in Step (205) continually requests the discrete graphics processing unit 200 for the current temperature thereof during another specific time period. This another specific time period is referred to as a second time period, and may be, for example, 5 minutes which is longer than the first time period described above. Since the details of Step (205) are similar to those of Step (202), details with respect to Step (205) will not be repeated.

In Step (206), the embedded controller 400 directly turns off the electric power of the discrete graphics processing unit 200 or directly turns off the electric power of the computer device 100.

Since by the time the method has reached Step (206), the embedded controller 400 has failed twice to obtain the current temperature from inside the discrete graphics processing unit 200, this indicates that there is a greater possibility that the discrete graphics processing unit 200 is disabled because of being overheated. Thus, the embedded controller 400 controls the system power unit 600 to turn off the electric power of the discrete graphics processing unit 200, or to turn off the whole electric power of the computer device 100.

With respect to the turning off of the electric power of the discrete graphics processing unit 200, in one specific embodiment, the embedded controller 400 can be configured to request the system power unit 600 to turn off the electric power of the discrete graphics processing unit 200. In another specific embodiment, an operation system of the computer device 100 can be configured to control the driver program of the discrete graphics processing unit 200 to turn off the electric power of the discrete graphics processing unit 200. Also, in a further another specific embodiment, the computer device 100 can be configured to switch to the integrated graphics processor 300 so that the integrated graphics processor 300 is activated for use as a main display process mode of the computer device 100, so as to avoid damage to the discrete graphics processing unit 200 or even the computer device 100 due to being overheated.

In summary, the independently installed temperature detection circuit associated with the discrete graphics processing unit can be omitted from the configuration of the computer device of the invention so as to reduce manufacturing costs, reduce power consumption, and minimize the amount of internal space utilized by circuitry in the computer device. Furthermore, even though the aforementioned temperature detection circuit is no longer installed in the computer device, through the aforementioned method for dissipating heat from the discrete graphics processing unit in the computer device, the computer device of the invention still can be instantly aware of temperature changes of the discrete graphics processing unit, and thereby achieve heat dissipation of the discrete graphics processing unit so as to avoid damage to the discrete graphics processing unit.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific examples of the embodiments disclosed and that modifications and other embodiments are intended to be included within the scope of the appended claims. Although specific terms are employed herein, they are used in a generic and descriptive sense only and not for purposes of limitation.

Although the present invention has been described with reference to the preferred embodiments thereof, it is apparent to those skilled in the art that a variety of modifications and changes may be made without departing from the scope of the present invention which is intended to be defined by the appended claims.

The reader's attention is directed to all papers and documents which are filed concurrently with this specification and which are open to public inspection with this specification, and the contents of all such papers and documents are incorporated herein by reference.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

What is claimed is:

1. A method for dissipating heat from a discrete graphics processing unit in a computer device, comprising:
    determining whether the discrete graphics processing unit is in an operating state;
    when the discrete graphics processing unit is in an operating state, determining whether a current temperature of the discrete graphics processing unit can be obtained from inside the discrete graphics processing unit by continually requesting the discrete graphics processing unit for the current temperature thereof during a first time period; and
    cooling the discrete graphics processing unit so as to lower the current temperature of the discrete graphics processing unit when the current temperature of the discrete graphics processing unit cannot be obtained from inside the discrete graphics processing unit.

2. The method for dissipating heat from the discrete graphics processing unit in the computer device according to claim 1, wherein determining whether the discrete graphics processing unit is in an operating state comprises:
    repeatedly detecting a pin of the discrete graphics processing unit for determining whether the pin of the discrete graphics processing unit is at a high electrical potential.

3. The method for dissipating heat from the discrete graphics processing unit in the computer device according to claim 2, wherein the pin of the discrete graphics processing unit is a power supply pin, an enable/disable pin or a backlight communication pin.

4. The method for dissipating heat from the discrete graphics processing unit in the computer device according to claim 1, wherein cooling the discrete graphics processing unit comprises:
    controlling a fan module to provide a maximum volume of air through a maximum RPM to dissipate heat from the discrete graphics processing unit.

5. The method for dissipating heat from the discrete graphics processing unit in the computer device according to claim 4 further comprising:
    determining whether a current temperature of the discrete graphics processing unit can be obtained from inside the discrete graphics processing unit after controlling the fan module to provide a maximum volume of air through a maximum RPM; and
    turning off the electric power of the discrete graphics processing unit or the computer device when the current temperature of the discrete graphics processing unit still cannot be obtained from inside the discrete graphics processing unit.

6. The method for dissipating heat from the discrete graphics processing unit in the computer device according to claim 5, wherein determining whether the current temperature of the discrete graphics processing unit can be obtained from inside the discrete graphics processing unit comprises:
    continually requesting the discrete graphics processing unit for the current temperature thereof during a second time period, wherein the second time period is longer than the first time period.

7. The method for dissipating heat from the discrete graphics processing unit in the computer device according to claim 1, wherein cooling the discrete graphics processing unit comprises:
    turning off the electric power of the discrete graphics processing unit or the computer device.

8. A computer device, comprising:
a discrete graphics processing unit;
a fan module; and
an embedded controller electrically connected the discrete graphics processing unit and the fan module, wherein
when the embedded controller determines that the discrete graphics processing unit is in an operating state, the embedded controller determines whether a current temperature of the discrete graphics processing unit can be obtained from inside the discrete graphics processing unit by continually requesting the discrete graphics processing unit for the current temperature thereof during a time period,
when the current temperature of the discrete graphics processing unit is obtained by the embedded controller, the embedded controller controls the fan module to provide a certain volume of air corresponding to the current temperature to dissipate heat from the discrete graphics processing unit, or
when the current temperature of the discrete graphics processing unit cannot be obtained by the embedded controller, the embedded controller lowers the current temperature of the discrete graphics processing unit.

9. The computer device according to claim 8, wherein when the embedded controller lowers the current temperature of the discrete graphics processing unit, the embedded controller
(1) controls the fan module to provide a maximum volume of air through a maximum RPM to dissipate heat from the discrete graphics processing unit,
(2) determines whether a current temperature of the discrete graphics processing unit can be obtained again from inside the discrete graphics processing unit after the fan module provides the maximum volume of air through a maximum RPM, and
(3) controls the fan module to provide a certain volume of air corresponding to the obtained current temperature to dissipate heat from the discrete graphics processing unit when the current temperature of the discrete graphics processing unit is obtained by the embedded controller, or turns off the electric power of the discrete graphics processing unit or the computer device when the current temperature of the discrete graphics processing unit cannot be obtained.

* * * * *